United States Patent
Kim et al.

[11] Patent Number: 5,820,946
[45] Date of Patent: Oct. 13, 1998

[54] METHOD FOR FABRICATING FERROELECTRIC THIN FILM

[75] Inventors: Tae Song Kim; Joon Han Kim; Dong Heon Lee; Jeon-Kook Lee; Hyung Jin Jung, all of Seoul, Rep. of Korea

[73] Assignee: Korea Institute of Science and Technology, Seoul, Rep. of Korea

[21] Appl. No.: 646,654

[22] Filed: May 8, 1996

[30] Foreign Application Priority Data

May 10, 1995 [KR] Rep. of Korea ................. 11460/1995

[51] Int. Cl.⁶ ........................................... C23C 14/34
[52] U.S. Cl. .................. 427/561; 427/596; 427/597; 427/255.3; 427/79; 427/126.3; 427/226; 427/240; 427/299; 204/192.18; 204/192.26; 204/192.2
[58] Field of Search .............. 204/192.18, 192.26, 204/192.2; 427/561, 596, 597, 255.3, 79, 126.3, 226, 240, 299

[56] References Cited

U.S. PATENT DOCUMENTS

| | | | |
|---|---|---|---|
| 4,731,172 | 3/1988 | Adachi et al. | 204/192.26 |
| 5,155,573 | 10/1992 | Abe et al. | 357/51 |
| 5,397,446 | 3/1995 | Ishihara et al. | 204/192.18 |
| 5,478,610 | 12/1995 | Desu et al. | 427/573 |
| 5,534,071 | 7/1996 | Varshney et al. | 118/726 |

FOREIGN PATENT DOCUMENTS 5259386  10/1993  Japan .

*Primary Examiner*—Shrive Beck
*Assistant Examiner*—Timothy Meeks
*Attorney, Agent, or Firm*—McDermott, Will & Emery

[57] ABSTRACT

A PZT ferroelectric thin film is sputter deposited on an electrode without microcracks while avoiding oxygen and Pb ion deficiencies at the electrode interface by initially forming a buffer layer containing a sufficient amount of a volatile Pb component and a sufficient amount of oxygen to easily absorb the energy of sputter particles. The PZT ferroelectric thin film can also be deposited by laser ablation.

7 Claims, 4 Drawing Sheets

METHOD FOR FABRICATING FERROELECTRIC THIN FILM

1. Field of the Invention

The present invention relates to a method for fabricating a ferroelectric thin film, and particularly to an improved method for fabricating a $Pb(Zr_{1-x}Ti_x)O_3$ (hereinafter called a PZT) ferroelectric thin film which is widely used in a device using characteristics such as piezo electricity, pyroelectric conduction, non-linear optical properties of a ferroelectric thin film, or a nonvolatile ferroelectric random access memory (hereinafter called an NVFRAM).

2. Description of the Conventional Art

Conventionally, since a ferroelectric thin film of a PZT group has a high dielectric constant, an excellent piezo electric property, a pyroelectric property, a good optical property, and the like, it has been widely used in a microactuator, an infrared ray detector, an optical device, and the like. Recently, as semiconductor process technology has been advanced, the ferroelectric thin film of a PZT group are considered as an important material of a nonvolatile ferroelectric random access memory device. Here, a representative example for using the PZT ferroelectric thin film as a material of a nonvolatile ferroelectric random access memory device, which is widely used in the semiconductor process, will now explained.

In order to use the ferroelectric thin film as a capacitor of the nonvolatile ferroelectric memory device, the residual polarization value should be high, the leakage current value should be low, and the residual polarization value and self-polarization value with respect to the time variation should not be changed. In addition, the fatigue characteristic should be excellent, and dielectric loss should be low.

Currently, as a ferroelectric thin film for use in the nonvolatile ferroelectric random access devices, many studies have been conducted on PZT, various compounds such as $SrBi_2Ta_2O_9$, $BaBi_2Ta_2O_9$, $Bi_4Ti_3O_{12}$, $Pb(Zr_{1-x}Ti)O_3$, and the like. In addition to that, studies for fabricating a thinner film to make a film having a desired excellent characteristic have been intensively conducted.

Among the above-mentioned studies, a sputtering method is most widely used, and is applied to a thin film fabrication method by using various kinds of materials. However, the above-mentioned sputtering method had a disadvantage in that it is difficult to adjust the volatility of the thin film.

In particular, a deposition method for using a thin film composed of Pb, Bi, or the like which has a high volatility characteristic is very difficult. Since the above-mentioned difficulties are increased when increasing the temperature of the substrate during the fabrication of the thin film, it is necessary to deposit at a lower temperature. In addition, an oxygen vacancy or a Pb positive ion vacancy existing at the interface contact with an electrode form a space charge, and a switching characteristic wherein a voltage flowing direction is periodically changed may be deteriorated.

The PZT ferroelectric material has a relatively high energy which is capable of causing damage to the deposition film when it is ejected from a target by an argon accelerating particle during sputtering thereof to form a thin film. Electrons within the plasma are accelerated to the substrate and may also cause damage to the deposited film.

The thin film hardened by the above-mentioned high energy particles has a compressive stress, which causes cracking of the thin film during a relaxation of the compressed stress during heating treatment. In addition, it is well known that cracking may occur due to volume variation by a phase change caused when cooling the thin film after heating and because of the difference of thermal expansion coefficient between the substrate and the thin film.

In addition, it is known that the PZT ferroelectric thin film deposited in the sputtering method is leaky due to nonstoichiometric defects which are caused by volatile components of the thin film or by a deposition process which is conducted under vacuum and when micro-cracks are caused during a heat treatment process.

SUMMARY OF THE INVENTION

Accordingly, it is an object of the present invention to provide a ferroelectric thin film fabrication method which overcomes the above-mentioned problems, and by which it is possible to prevent an occurrence of micro-cracks of a ferroelectric thin film and an oxygen and a Pb ion deficiency at an interface between an electrode and a thin film, and to absorb the energy of sputtered particles by forming a buffer layer, in which a sufficient amount of oxygen is contained and a Pb component is contained as an additional element which easily becomes volatile, on a substrate before depositing a PZT ferroelectric thin film.

To achieve the above objects, there is provided a ferroelectric thin film fabrication method, which is directed to inserting a buffer layer containing an additional Pb component when fabricating a PZT thin film wherein a PZT ferroelectric thin film is fabricated in a sputtering method or a laser ablation method.

DETAILED DESCRIPTION OF THE INVENTION

Figure 1A:
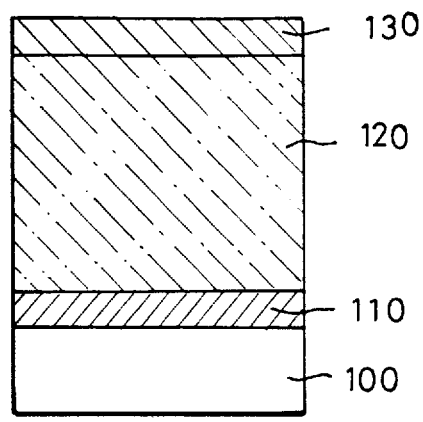
FIGS. 1A and 1B are cross-sectional views of $Pb(Zr_{1-x}Ti_x)O_3$ thin film structures which are fabricated in accordance with the present invention.
Figure 1B:
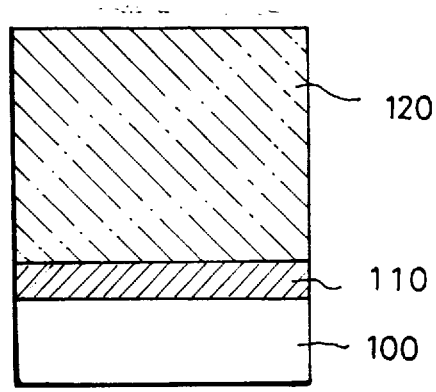

FIGS. 1A and 1B show cross-sectional views of a PZT ferroelectric thin film according to the present invention, of which FIG. 1A shows a construction wherein buffer layers 110 and 130 are respectively formed before and after the formation of a PZT thin film 120, and FIG. 1B shows a construction wherein a buffer layer 110 is formed before the formation of a PZT thin film 120.

As shown therein, a method of fabricating ferroelectric thin film structure according to the present invention is directed to inserting a bottom buffer layer 110(or a bottom buffer layer 110 and a top buffer layer 130), having a thickness of 10–100 nm and containing an additional Pb component which physically and chemically acts as a buffer layer in a deposition method, and which does not cause an over stress or component changes, before (or before and after) depositing a PZT thin film on a substrate.

The embodiment of the present invention, which is directed to forming a PZT ferroelectric thin film by forming a buffer layer before (or before and after) depositing the PZT thin film in a sputtering method will now be explained.

To begin with, a bottom buffer layer 110 having a thin thickness and physically and chemically acting as a buffer layer is formed on the substrate 100 by a sol-gel method such as a spin coating method, or a dip coating method. Here, the substrate 100 is formed with a four-layer structure in which Pt/Ti/SiO$_2$/Si are sequentially deposited; however, in this embodiment, it is simply called a substrate 100.

Thereafter, a PZT thin layer 120 is formed on the bottom buffer layer in a sputtering method or a laser ablation method, and a top buffer layer 130 is formed on the PZT thin film 120 by a sol-gel method.

Here, the top and bottom buffer layers 130 and 110 may be deposited in any conventional method, such as metalorganic chemical vapor deposition ("MOCVD"), liquid source chemical vapor deposition ("LSCVD"), metalorganic decomposition ("MOD") or the like capable of occurrence of any stress in a film during the deposition of the buffer layer.

A component of the thin film of the deposited top and bottom buffer layers 130 and 110 may be the same component as in a PZT thin film to be deposited in a sputtering method or a thin film containing a volatile component. For example, there are PbO, Pb(Zr$_{1-x}$Ti$_x$)O$_3$ or PbTiO$_3$ in which an additional volatile Pb component is contained.

At this time, the bottom buffer layer 110 may be heat-treated before a sputtering process so as to remove a carbon component contained therein or to provide a crystal property. The temperature of heat treatment is 400°–800° C., and the heat treatment may be performed by heating in an electric furnace, a direct heating method of passing-through a hot zone of a tube furnace, a rapid thermal heating method, and the like.

When an in-situ heating is performed during the sputtering process, the heat treatment is not necessary before the sputtering process. The top buffer layer 130 formed after the sputtering process is heat-treated using one of the above-mentioned methods.

Here, the sputtering is performed using an off-axis sputtering method so as to reduce the effects of oxygen anions contained in the plasma.

Figure 2:
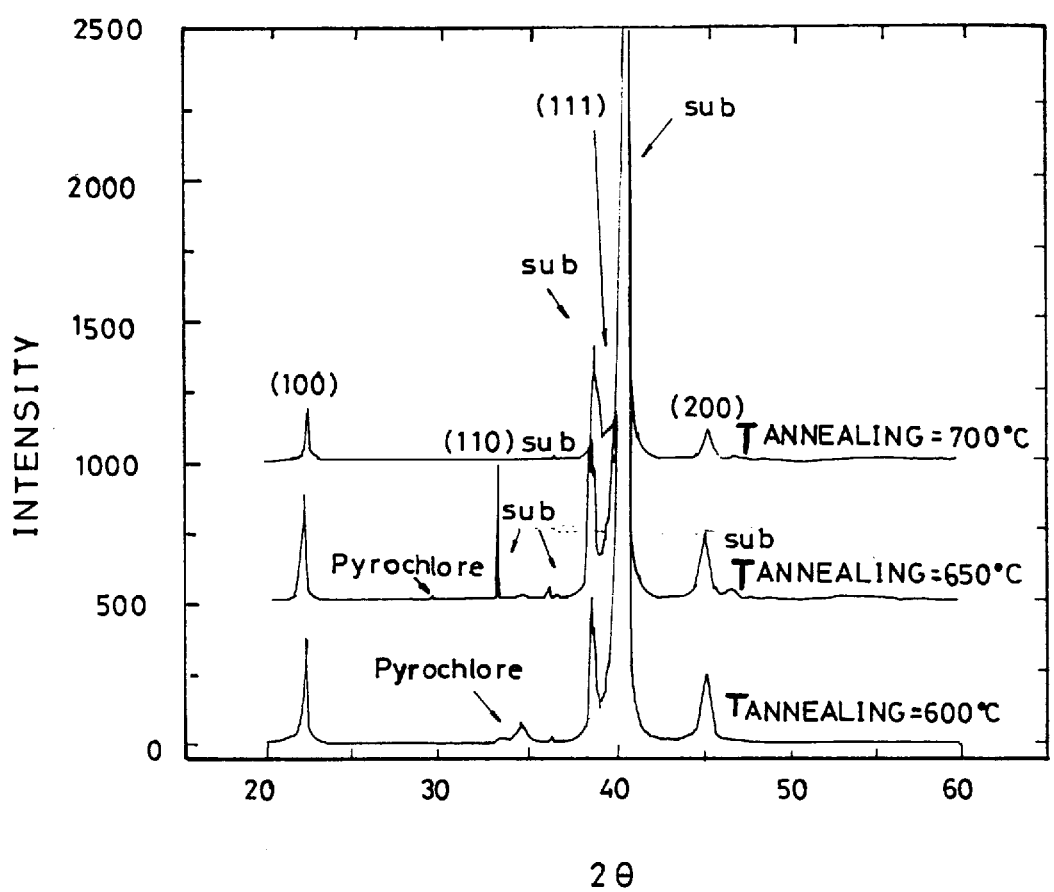
FIG. 2 is a graph showing a result of an X-ray diffraction (XRD) of a $Pb(Zr_{1-x}Ti_x)O_3$ ferroelectric thin film which is deposited on a buffer layer in an RF magnetron sputtering method according to the present invention.

FIG. 2 shows a graph showing an X-ray diffraction (XRD) analysis result with respect to a PZT thin film, in which Zr and Ti are contained at a ratio of 52:48, having a thickness of 350 nm and fabricated by forming buffer layers 130 and 110 on the top and bottom portions of the PZT thin film 120.

In accordance with the graph, the crystallization level is increased compared to when the buffer layer is not formed. A thin film having a large orientation is deposited in a (100) direction.

Figure 3:
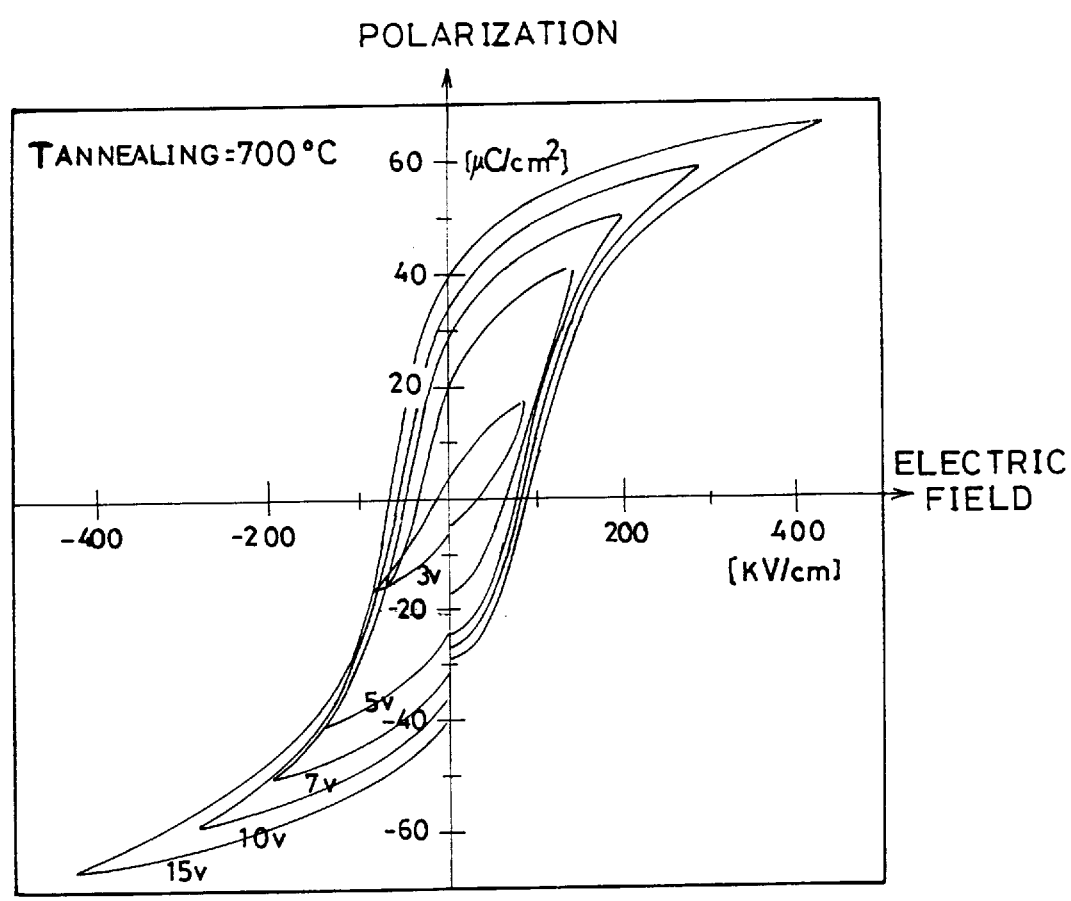
FIG. 3 is a graph showing a P-E(polarization-electric field) hysteresis curve variation in accordance with a variation of supplied voltage of a $Pb(Zr_{1-x}Ti_x)O_3$ ferroelectric thin film deposited on a buffer layer in an RF magnetron sputtering method according to the present invention.

Meanwhile, FIG. 3 shows a polarization-electric field (P-E) hysteresis curve. In accordance with the curve, it appears that the residual dielectric polarization value Pr is increased in accordance with the temperature of the heat treatment, and the coercive electric field value (Ec) is decreased.

Here, a point at which the hysteresis curve and the electric field axis intersect denotes a coercive electric field value. A point at which the hysteresis curve and the polarization axis intersects denotes a remanent polarization value.

TABLE I

| Temp. | Saturation polarization: Ps($\mu$C/cm$^2$) | Residual dielectric polarization: Pr($\mu$C/cm$^2$) | Coercive electric field: Ec (kV/cm) |
|---|---|---|---|
| 600° C. | 23.2 | 12.1 | 108 |
| 650° C. | 41.7 | 22.45 | 72.9 |
| 700° C. | 58.5 | 34.64 | 68.3 |

Figure 4:
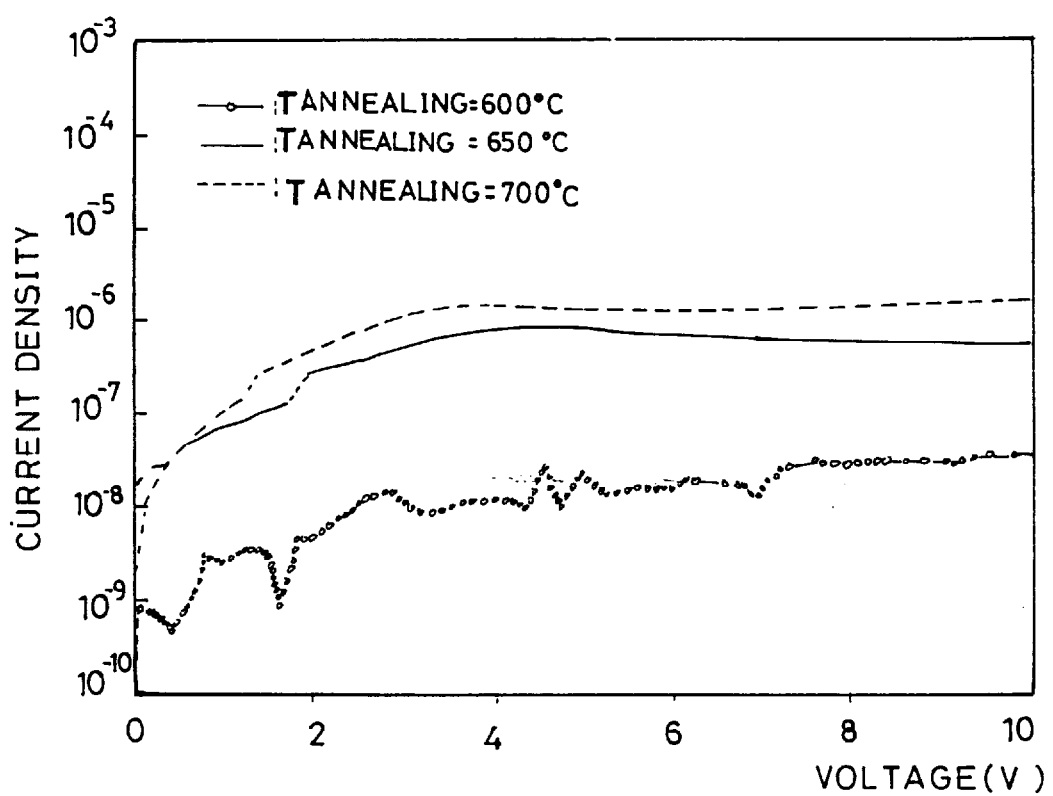
FIG. 4 is a graph showing a leakage current variation in accordance with an increase of supplied voltage of a $Pb(Zr_{1-x}Ti_x)O_3$ ferroelectric thin film in which a buffer layer is inserted according to the present invention.

Table I shows a remanent polarization value and a coercive electric field value when supplying a voltage of 10V. In accordance with the table, it appears that a sufficient level of remanent polarization value can be present at the heat treatment temperature of 600° C. The leakage current variation of the thin film is shown in FIG. 4. The leakage current variation is lowest at a temperature of 600° C.

As described above, the inventive ferroelectric thin film fabrication method has several advantages; firstly a thin film deposited in accordance with the present invention exhibits excellent electrical characteristics without micro cracking. It is also possible to prevent an oxygen deficiency or a Pb ion deficiency at an interface between an electrode and the deposited thin film. It is further possible to fabricate a PZT ferroelectric thin film with high reliability, capable of absorbing energy of particles sputtered thereon.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method of fabricating a Pb(Zr$_{1-x}$Ti$_x$)O$_3$ ferroelectric thin film, comprising:

depositing a buffer layer, comprising Pb(Zr$_{1-x}$Ti$_x$)O$_3$ or PbTiO$_3$ containing, as deposited, an additional volatile Pb component, by a deposition process other than sputtering; and depositing the ferroelectric thin film on the buffer layer by sputtering or laser ablation;

whereby the buffer layer prevents damage to the ferroelectric thin film during its deposition and/or upon subsequent heating and cooling treatment thereof.

2. The method according to claim 1, wherein said buffer layer is formed by a sol-gel technique, MOCVD, LSCVD or MOD.

3. The method according to claim 2, wherein the sol-gel technique is spin coating or dip coating.

4. The method according to claim 1, wherein said buffer layer is formed to a thickness of 10–100 nm.

5. The method according to claim 1, wherein a second buffer layer is formed on the deposited ferroelectric thin film by a deposition process other than sputtering.

6. The method according to claim 5, further comprising heating said ferroelectric thin film after deposition of the second buffer layer.

7. A method of fabricating a Pb(Zr$_{1-x}$Ti$_x$)O$_3$ ferroelectric thin film, comprising:

depositing a buffer layer, comprising lead and oxygen, by a deposition process selected from a sol-gel technique, MOCVD, LSCVD, and MOD; and depositing the ferroelectric thin film on the buffer layer by sputtering or laser ablation.

* * * * *